US012235056B1

(12) United States Patent
An et al.

(10) Patent No.: US 12,235,056 B1
(45) Date of Patent: Feb. 25, 2025

(54) SYSTEM FOR BLIND MATE HYDRAULIC CONNECTIONS

(71) Applicant: ZT Group Int'l, Inc., Secaucus, NJ (US)

(72) Inventors: Chen An, Secaucus, NJ (US); Zichun Song, Secaucus, NJ (US); Sruti Chigullapalli, Secaucus, NJ (US); Mahesh Kumar Varrey, Secaucus, NJ (US); Yu Wang, Secaucus, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 239 days.

(21) Appl. No.: 18/088,911

(22) Filed: Dec. 27, 2022

(51) Int. Cl.
*F16L 37/00* (2006.01)
*F16L 37/52* (2006.01)
*F28F 9/02* (2006.01)
*H05K 7/20* (2006.01)

(52) U.S. Cl.
CPC .......... *F28F 9/0258* (2013.01); *F16L 37/002* (2013.01); *F16L 37/52* (2013.01); *H05K 7/20772* (2013.01)

(58) Field of Classification Search
CPC .......................... H05K 7/20218–20281; H05K 7/20627–20654; H05K 7/20763–2079; F28F 9/0258; F16L 37/002; F16L 37/52
See application file for complete search history.

(56) References Cited

U.S. PATENT DOCUMENTS

| | | | | |
|---|---|---|---|---|
| 8,336,922 | B2* | 12/2012 | Tiberghien | F16L 39/00 137/594 |
| 9,351,428 | B2* | 5/2016 | Eckberg | F16L 37/34 |
| 9,375,988 | B2* | 6/2016 | Huegerich | B60D 1/62 |
| 9,417,011 | B2* | 8/2016 | Burgers | F28F 9/0258 |
| 10,164,373 | B1* | 12/2018 | Cheon | H05K 7/20781 |
| 10,188,016 | B2* | 1/2019 | Lunsman | H05K 7/20263 |
| 10,288,198 | B2* | 5/2019 | Tiberghien | H05K 7/20272 |
| 10,349,560 | B2* | 7/2019 | Norton | H05K 7/20709 |
| 10,405,458 | B2* | 9/2019 | Fukunaga | H05K 7/20272 |
| 10,701,838 | B1* | 6/2020 | Conroy | H05K 7/20781 |
| 10,791,654 | B2* | 9/2020 | McCordic | H05K 7/20645 |
| 10,921,070 | B2* | 2/2021 | Chen | H05K 7/20272 |
| 11,388,832 | B2* | 7/2022 | Shao | H05K 7/20836 |
| 11,439,035 | B2* | 9/2022 | Thibaut | H05K 7/1452 |
| 11,452,237 | B2* | 9/2022 | Tan | H05K 7/20272 |
| 11,503,743 | B2* | 11/2022 | Gao | H05K 7/20781 |
| 11,553,627 | B1* | 1/2023 | Gregory | H05K 7/20781 |
| 11,892,252 | B2* | 2/2024 | Yang | H05K 7/20772 |
| 2016/0270260 | A1* | 9/2016 | Franz | H05K 7/20781 |
| 2022/0304191 | A1* | 9/2022 | Gao | H05K 7/20781 |
| 2024/0224466 | A1* | 7/2024 | An | F16L 37/12 |

* cited by examiner

*Primary Examiner* — Robert J Hoffberg
(74) *Attorney, Agent, or Firm* — Dergosits & Noah LLP; Todd A. Noah

(57) ABSTRACT

An apparatus is provided for completing a blind mate hydraulic connection. A device is equipped at the rear of the device with a shell holding a manifold connected internally to the device cooling system. Clearances between the shell and manifold allow the manifold to rotate in two axes to adapt to a misalignment between the manifold and a rack cooling system. The device is further provided with a cam-handle attached to the front that provides leverage against the rack for overcoming the connection forces of the blind mate. The manifold and cam-handle combine to facilitate disconnecting the device from the rack cooling system from the front of the rack and servicing the device.

16 Claims, 19 Drawing Sheets

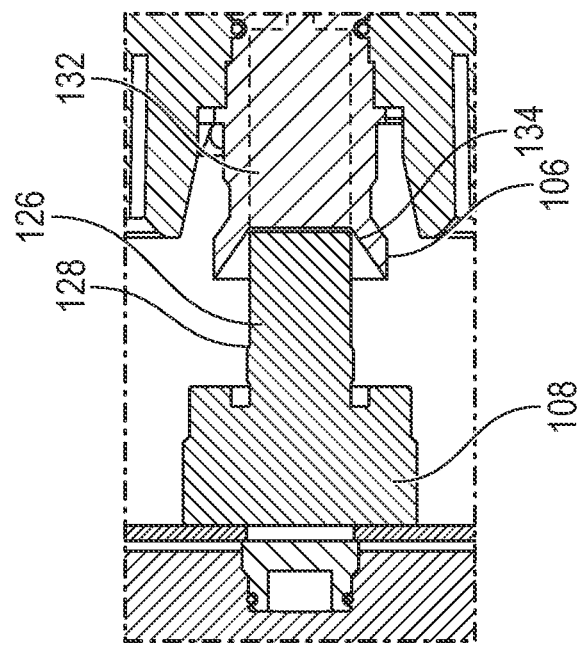
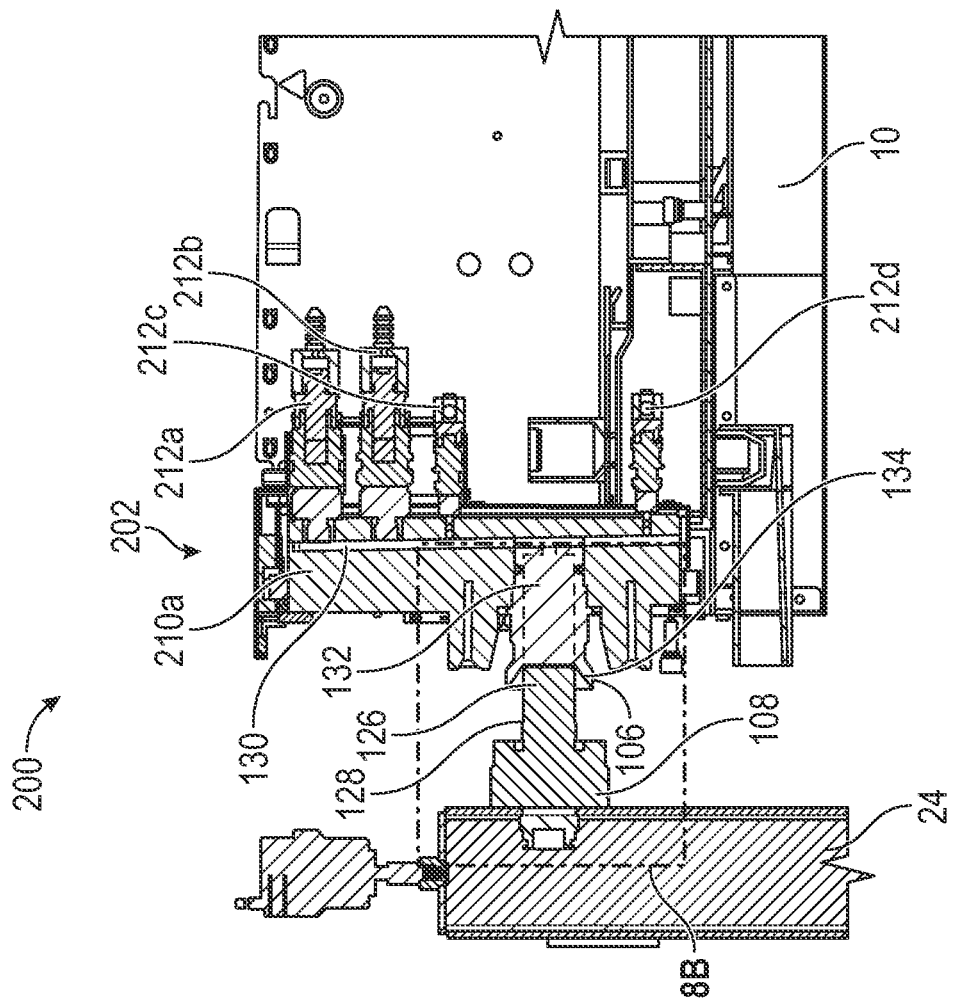

US 12,235,056 B1

SYSTEM FOR BLIND MATE HYDRAULIC CONNECTIONS

FIELD OF THE INVENTION

The present subject matter relates generally to hydraulic connections and, in particular, to blind, hands-free hydraulic connections.

BACKGROUND

Typically, a CDU (cooling distribution unit) supplies coolant to a rack and receives heated coolant in return. For each liquid-cooled device (e.g., a server) in a rack, the rack needs a set of fluid manifolds, one manifold for supplying fluid to the device and one for receiving the heated fluid from the device. On the server-side the connections are typically made using drip-less quick-disconnects. For such systems, the user must disconnect or otherwise service the quick-disconnects from the rear of the rack, since that is where they may be accessed. This is undesirable since the hydraulic hoses and the cold plate of the device may be damaged if the user unknowingly attempts to remove the device from the front of the rack without properly disconnecting all the quick-disconnects.

Thus, what is needed is an apparatus that provides for the blind connection and disconnection of the device from the rack cooling system, from the front of the rack.

BRIEF DESCRIPTION OF THE DRAWINGS

The embodiments are illustrated by way of example and not limitation in the accompanying drawings, in which like references indicate similar elements, and in which:

FIG. 8A is a left cross-sectional view of aspects of the embodiment of a system for blind mate hydraulic connections of FIG. 2 in a first state;

FIG. 8B is an enlarged view of a section of FIG. 8A;

DETAILED DESCRIPTION

Embodiments described within disclose a manifold with a blind mate fitting for connecting to the rack cooling system and internal fittings for connecting to the device cooling system. One or more cam-handles attached to the front of the device provide leverage for overcoming the connection forces of the blind mate. The manifold and cam-handle combine to facilitate servicing the device from the front of the rack.

Figure 1:
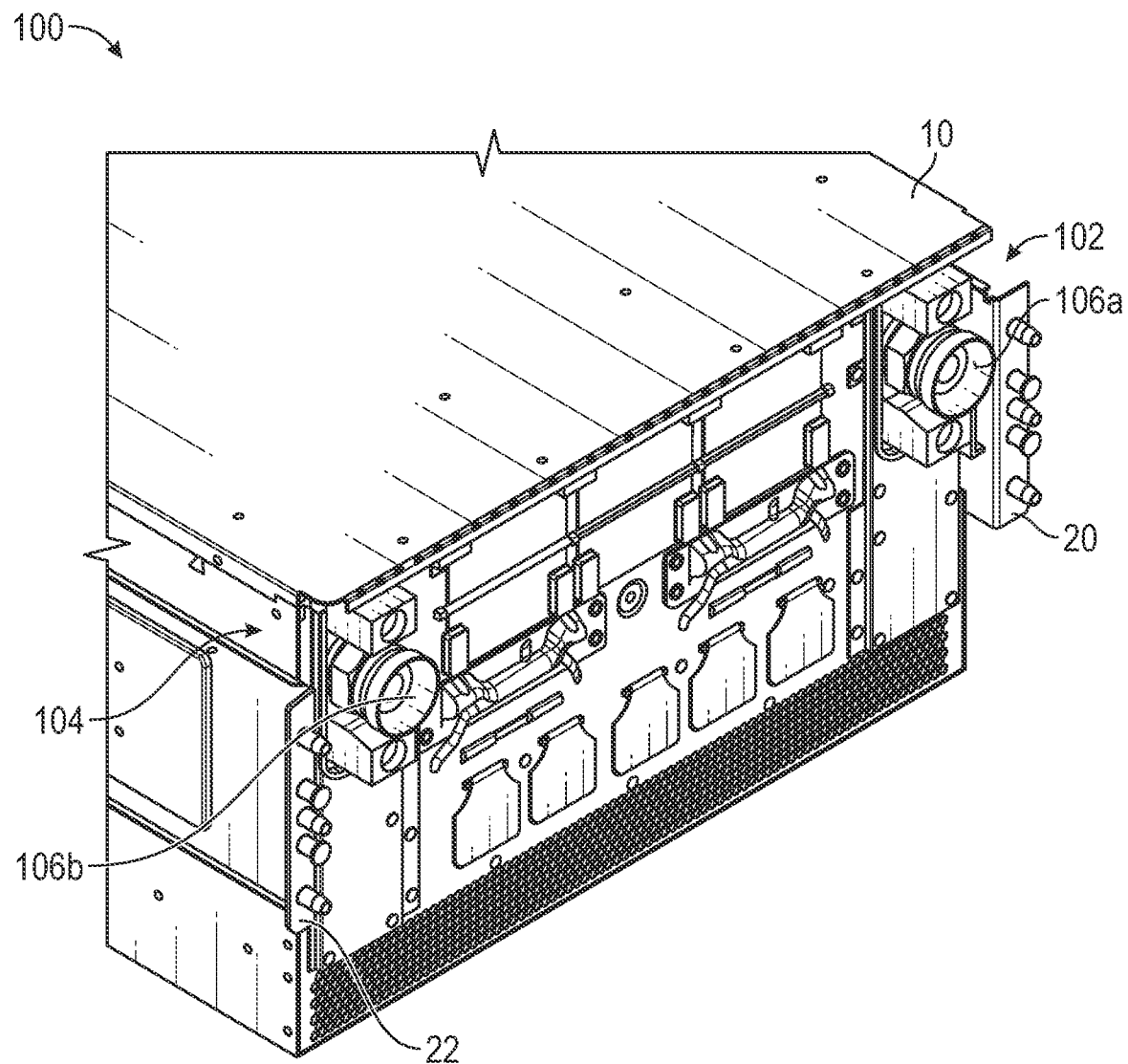
FIG. 1 is an upper right rear isometric view of an embodiment of a system for blind mate hydraulic connections.

FIG. 1 is an upper right rear isometric view of an embodiment of a system 100 for blind mate hydraulic connections. In FIG. 1, a device 10 is equipped with system 100, which includes an inlet hydraulic connection 102 and an outlet hydraulic connection 104. Device 10 is connected to a rack 30 (FIG. 10A) by rails 20, 22. Each hydraulic connection 102, 104 includes a quick connection fitting 106a, 106b. In this disclosure, reference numbers that include a letter designation denote specific instantiations of the same element. Thus, description of one instantiation of the element applies to all instantiations of that element as does the general description of the element.

Figure 2:
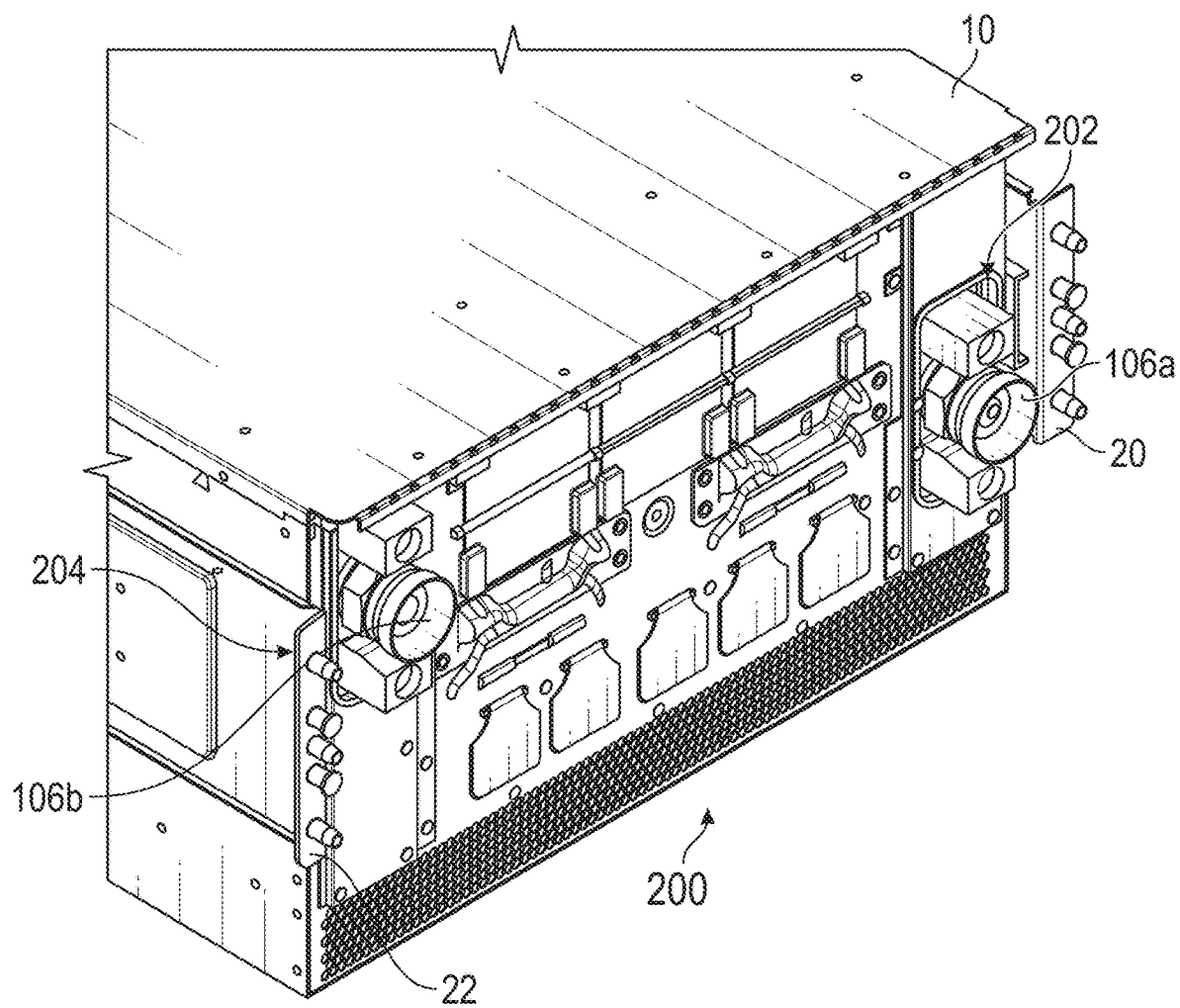
FIG. 2 is an upper right rear isometric view of an embodiment of a system for blind mate hydraulic connections.

FIG. 2 is an upper right rear isometric view of an embodiment of a system 200 for blind mate hydraulic connections. In FIG. 2, device 10 is equipped with system 200, which includes an inlet hydraulic connection 202 and an outlet hydraulic connection 204. Each hydraulic connection 202, 204 includes a quick connection fitting 106a, 106b. From this point of view, hydraulic connections 202, 204 differ from hydraulic connections 102, 104 only by being relatively lower on device 10 than connections 102, 104.

Figure 3:
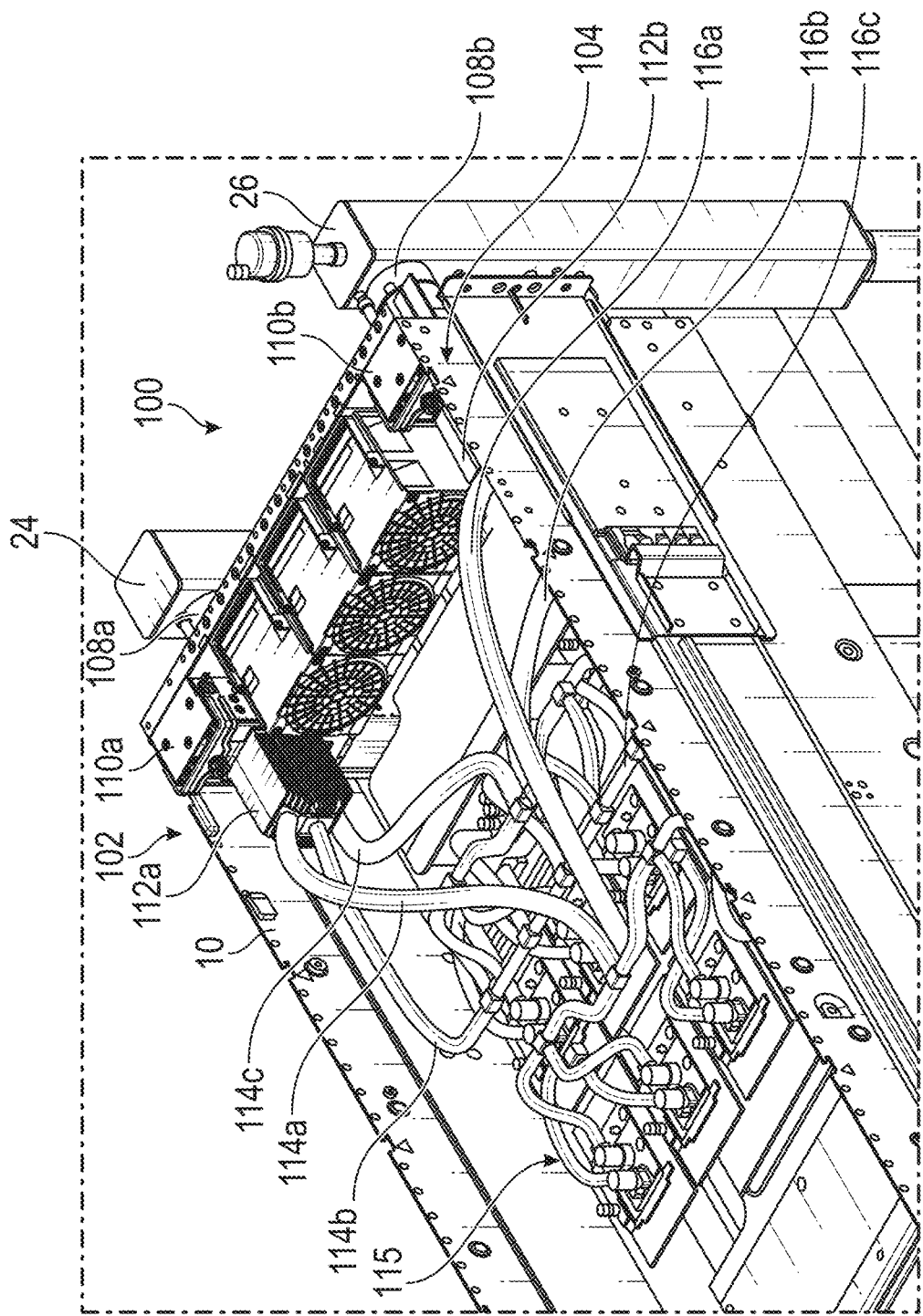
FIG. 3 is an upper right front isometric view of the embodiment of a system for blind mate hydraulic connections of FIG. 1.

FIG. 3 is an upper right front isometric view of system 100 of FIG. 1. In FIG. 1, rack 30 (FIG. 10A) includes rack legs 24, 26, each provided with a hydraulic fitting 108a, 108*b*, respectively. Fitting 108*a* is connected to the outlet or cold-side of the rack cooling system and fitting 108*b* is connected to the inlet or hot-side of the rack cooling system. Within device 10, system 100 includes manifolds 110*a*, 110*b*. Manifold 110*a* is connected by a 3-prong manifold 112*a* to coolant inlet lines 114*a* . . . 114*c*, which supply coolant to cold plates 115. Manifold 110*b* is connected by a 3-prong manifold 112*b* to outlet lines 116*a*, 116*b*, 116*c* (obscured), which receive heated coolant from cold plates 115. Cold plates 115 may, for example, cool CPUs, GPUs, or other heat-producing devices. Thus, system 100 provides an internal hydraulic flow path passing through: manifold 110*a*, manifold 112*a*, inlet lines 114*a* . . . 114*c*, cold plates 115, outlet lines 116*a* . . . 116*c*, manifold 112*b*, and manifold 110*b*.

Figure 4:
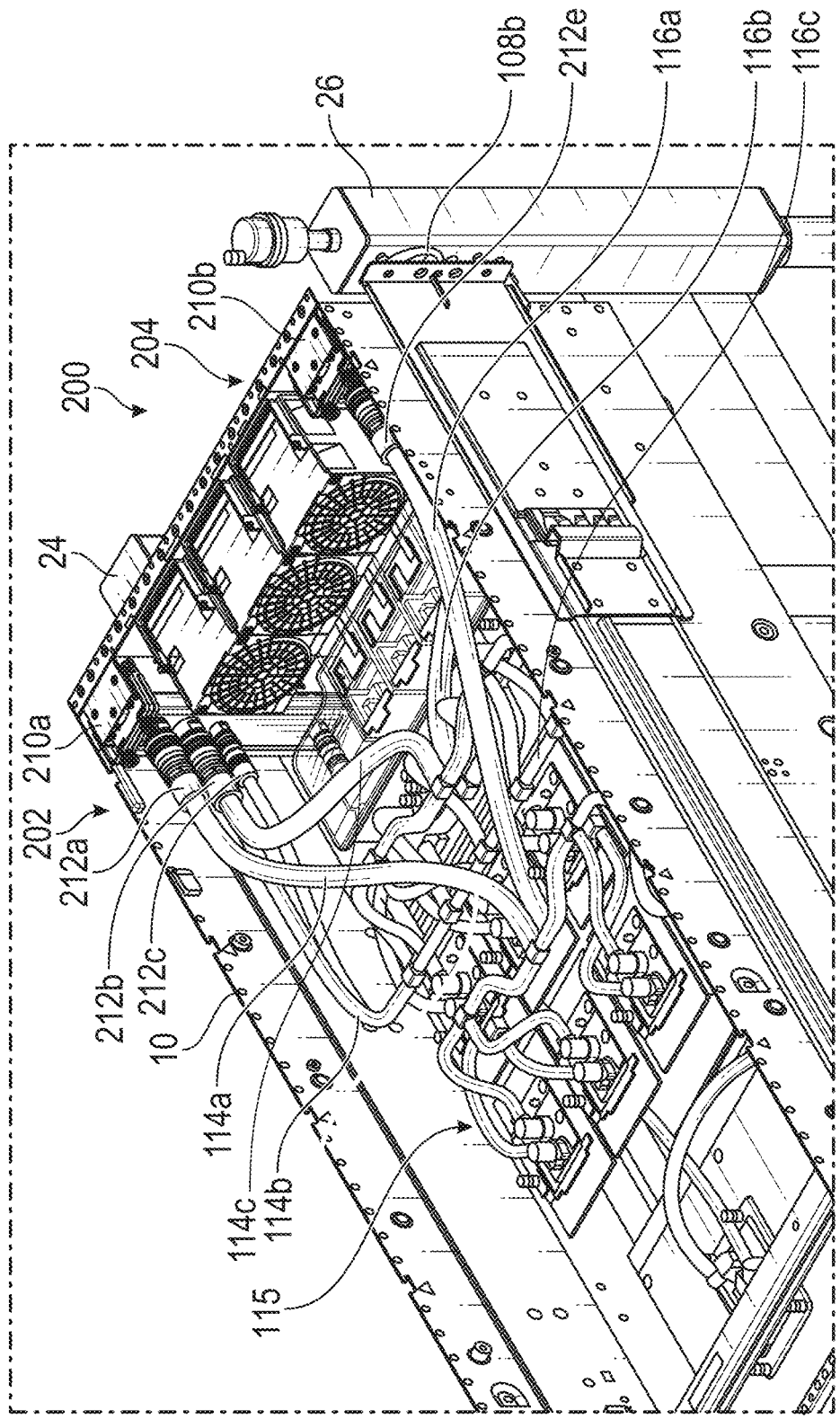
FIG. 4 is an upper right front isometric view of the embodiment of a system for blind mate hydraulic connections of FIG. 2.

FIG. 4 is an upper right front isometric view of the embodiment of a system 200 for blind mate hydraulic connections of FIG. 2. In FIG. 4, within device 10, system 200 includes manifolds 210*a*, 210*b*. Manifold 210*a* is connected by quick disconnects 212*a* . . . 212*d* (212*d* is obscured) to coolant inlet lines 114*a* . . . 114*d* (114*d* is obscured), which provide coolant to cold plates 115. Manifold 210*b* is connected by quick disconnects 212*e* . . . 212*h* (212*f* . . . 212*h* are obscured) to coolant outlet lines 116*a* . . . 116*d* (116*b* . . . 116*d* are obscured), which receive heated coolant from cold plates 115. Thus, system 100 provides an internal hydraulic flow path passing through: manifold 210*a*, quick disconnects 212*a* . . . 212*d*, inlet lines 114, cold plates 115, outlet lines 116, quick disconnects 212*e* . . . 212*f* (212*f* is obscured), and manifold 210*b*.

Figure 5A:
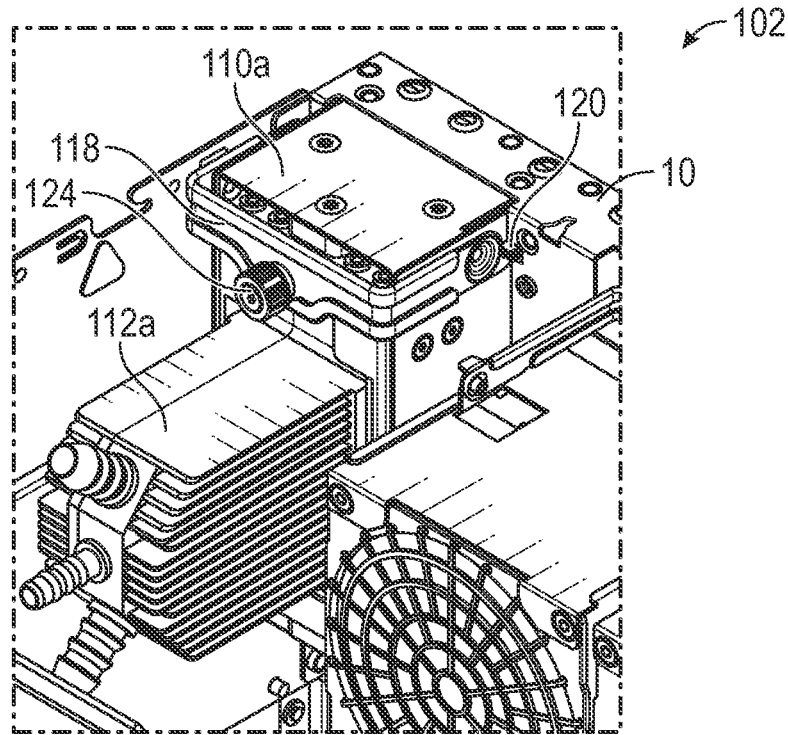
FIG. 5A is an upper right front isometric view of aspects of the embodiment of a system for blind mate hydraulic connections of FIG. 1.
Figure 5B:
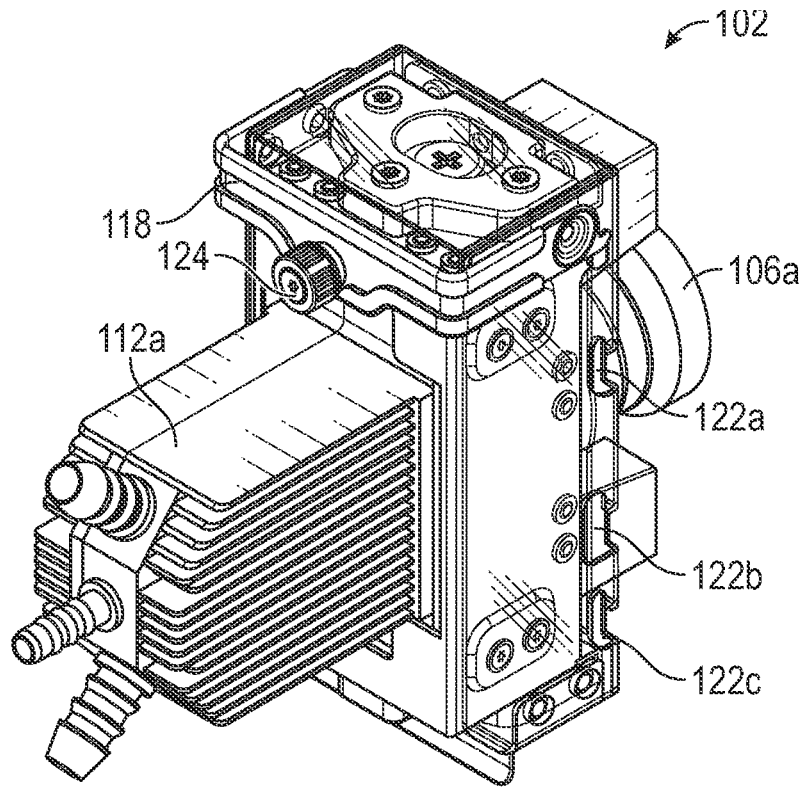
FIG. 5B is an upper right front isometric view of aspects of the embodiment of a system for blind mate hydraulic connections of FIG. 1.

FIG. 5A is an upper right front isometric view of aspects of system 100 of FIG. 1. In FIG. 5A, manifold 110*a* includes a retaining lever 118. As shown, lever 118 includes a tooth that interferes with a striker 120 of device 10 if an attempt is made to raise manifold 110*a*. A thumbscrew 124 maintains lever 118 in place. FIG. 5B illustrates that manifold 110*a* includes mounting slots 122 that engage posts 224 (FIG. 7) of device 10 to hold manifold 110*a* in place within device 10. Thus, posts 224, manifold mounting slots 122, striker 120, and lever 118 combine to provide a tool-less mount for manifold 110.

Figure 6A:
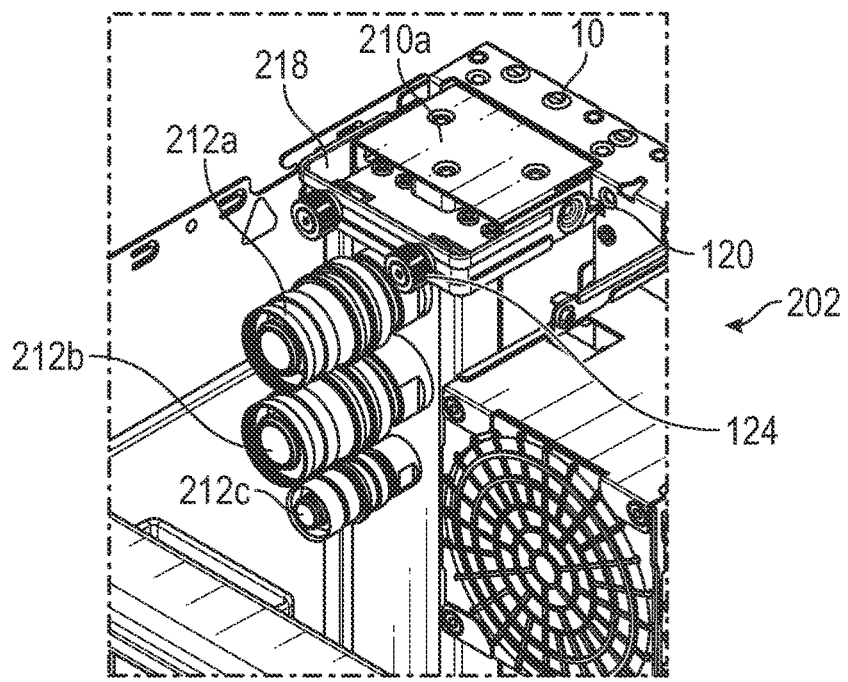
FIG. 6A is an upper right front isometric view of aspects of the embodiment of a system for blind mate hydraulic connections of FIG. 2.
Figure 6B:
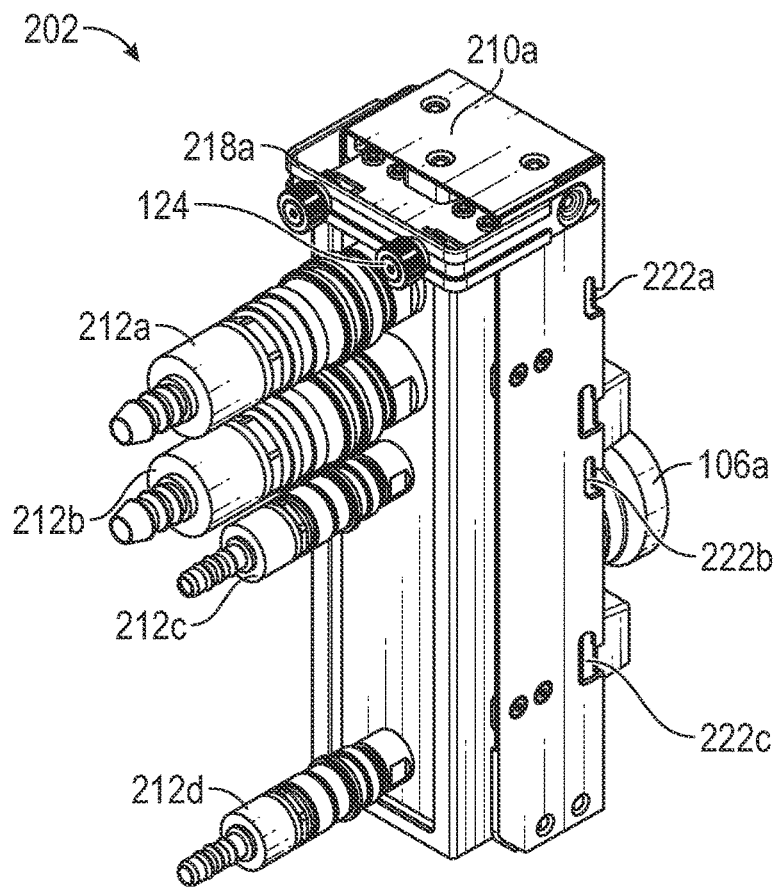
FIG. 6B is an upper right front isometric view of aspects of the embodiment of a system for blind mate hydraulic connections of FIG. 2.
Figure 6C:
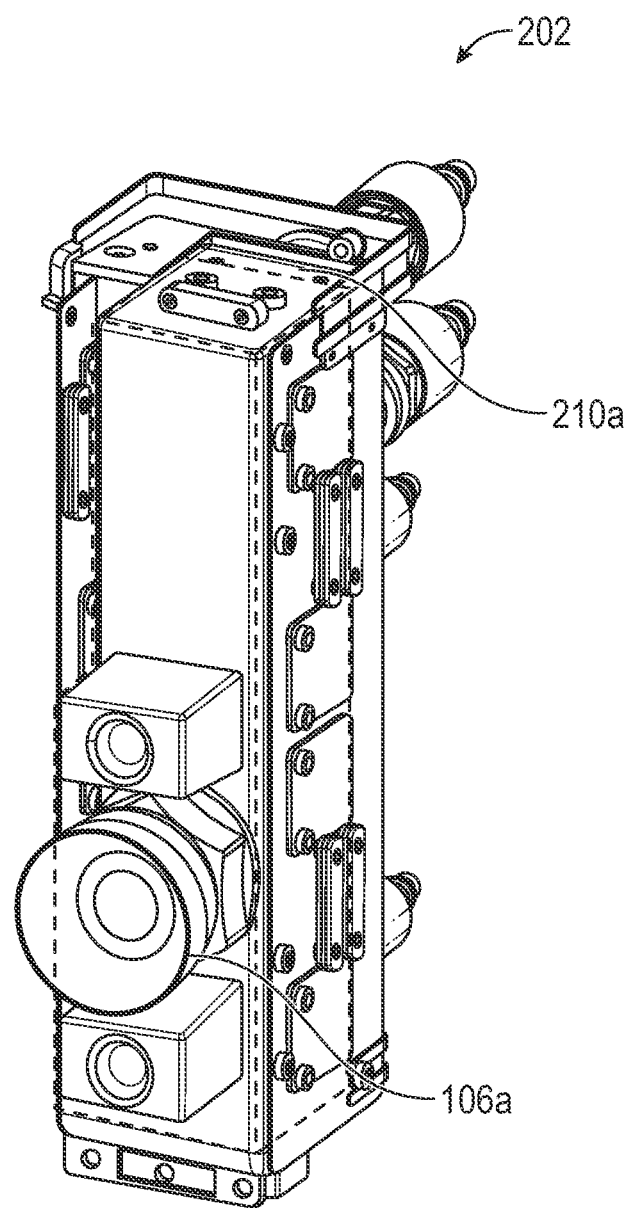
FIG. 6C is an upper right front isometric view of aspects of the embodiment of a system for blind mate hydraulic connections of FIG. 2.

FIG. 6A is an upper right front isometric view of aspects of system 200 of FIG. 2. In FIG. 6A, manifold 210*a* includes a retaining lever 218 that functions as described with respect to lever 118 of FIG. 5A. FIG. 6B illustrates that manifold 210*a* includes mounting slots 222*a* . . . 222*c* that engage posts 224 (FIG. 7) of device 10 to hold manifold 210*a* in place. Thus, posts 224, manifold mounting slots 222, striker 120, and lever 218 combine to provide a tool-less mount for manifold 210. FIG. 6C illustrates the relatively lower position of quick connect 106 in manifold 210 than in manifold 110.

Figure 7:
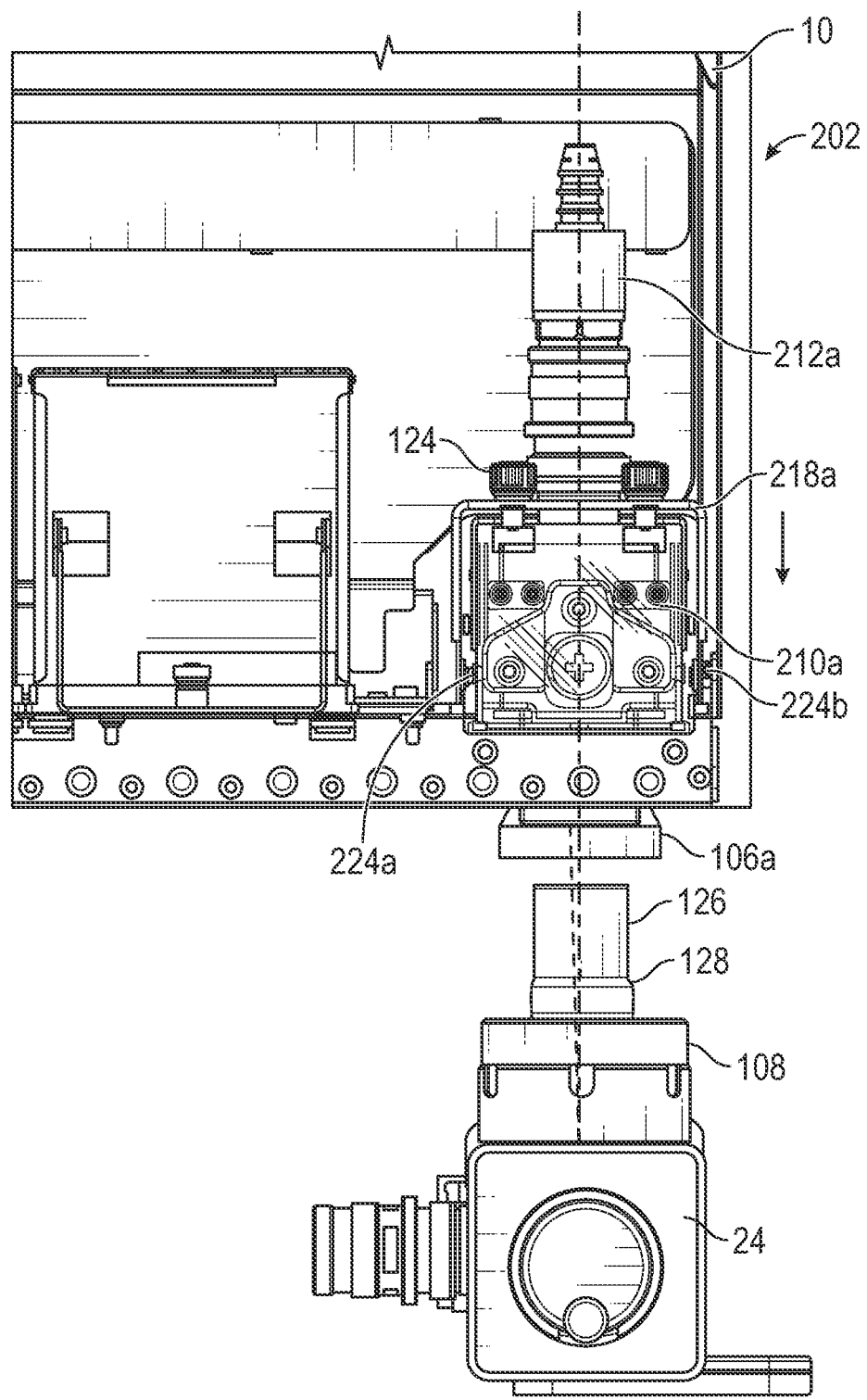
FIG. 7 is a top view of aspects of the embodiment of a system for blind mate hydraulic connections of FIG. 2.

FIG. 7 is a top view of aspects of the embodiment of the system for blind mate hydraulic connections of FIG. 2. While the following description in FIG. 7-FIG. 11 is largely directed to system 200, quick connect 106 and rack coolant connector 108 are the same for both systems 100 and 200 and the following description applies equally to each. In FIG. 7, rack coolant connector 108 is provided with a nozzle 126, about which is disposed a chamfer 128. When device 10 is inserted into rack 30 ("down" in this view), quick connect 106*a* receives nozzle 126 into a bore 132 (FIG. 8B).

FIG. 8A is a left cross-sectional view of aspects of the embodiment of the system for blind mate hydraulic connections of FIG. 2 in a first, disconnected state. FIG. 8B is an enlarged view of a section of FIG. 8A. In FIG. 8A and FIG. 8B, nozzle 126 is poised to enter bore 132 of fitting 106.

Fitting 106 is shown to be connected within manifold 210*a* by passages 130 to quick connects 212*a* . . . 212*d*. Quick connect 106 includes a chamfer 134 that is angled with respect to bore 132. If nozzle 126 is misaligned with respect to bore 132, the angle of chamfer 134 works to direct nozzle 126 into bore 132. In an embodiment, chamfer 134 is at a 45° angle with respect to the center axis of bore 132, which is sufficient to correct misalignments of approximately 1° between the center axes of nozzle 126 and bore 132.

Figure 9B:
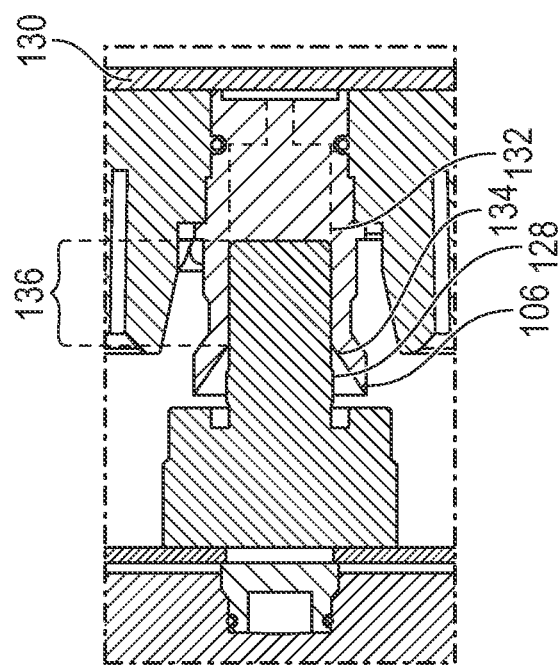
FIG. 9B is an enlarged view of a section of FIG. 9A.
Figure 9A:
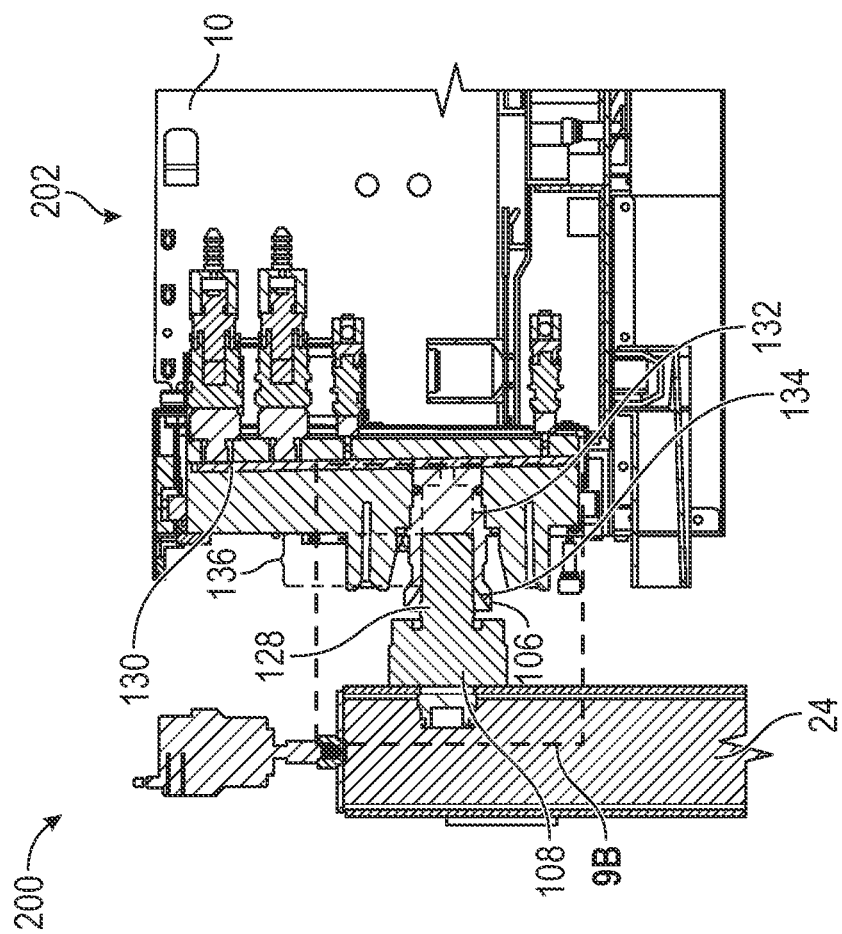
FIG. 9A is a left cross-sectional view of aspects of the embodiment of a system for blind mate hydraulic connections of FIG. 2 in a second state.

FIG. 9A is a left cross-sectional view of aspects of the embodiment of a system for blind mate hydraulic connections of FIG. 2 in a second, connected state. FIG. 9B is an enlarged view of a section of FIG. 9A. In FIG. 9A and FIG. 9B, with further movement of device 10 toward rack leg 24, nozzle 126 has entered bore 132 of fitting 106 a distance 136. Thus, a hydraulic connection is created between the rack cooling system (rack leg 24) and the device cooling system. In the embodiment, the clearance between bore 132 and nozzle 126 is configured to be small enough that, in concert with nozzle 126 being inserted distance 136, the clearance is relied upon to seal the connection. In an embodiment, nozzle 126 may be inserted into bore 132 until bore 132 contacts and forms a seal against chamfer 128. In an embodiment, one or more seals, such as an O-ring within an annular groove located about nozzle 126 between chamfer 128 and the nozzle tip, and/or an O-ring within an annular groove located within bore 132 are used to create a seal between quick connect fitting 106 and nozzle 126.

Figure 10B:
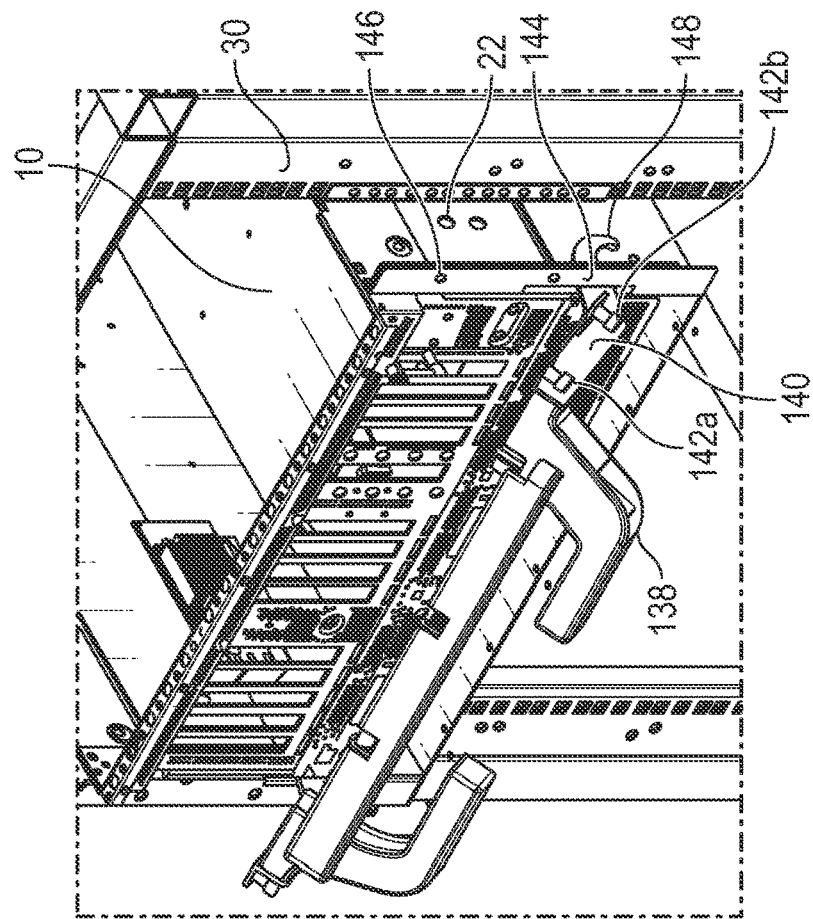
FIG. 10B is an upper left front isometric view of the embodiment of FIG. 10A in a second state.
Figure 10A:
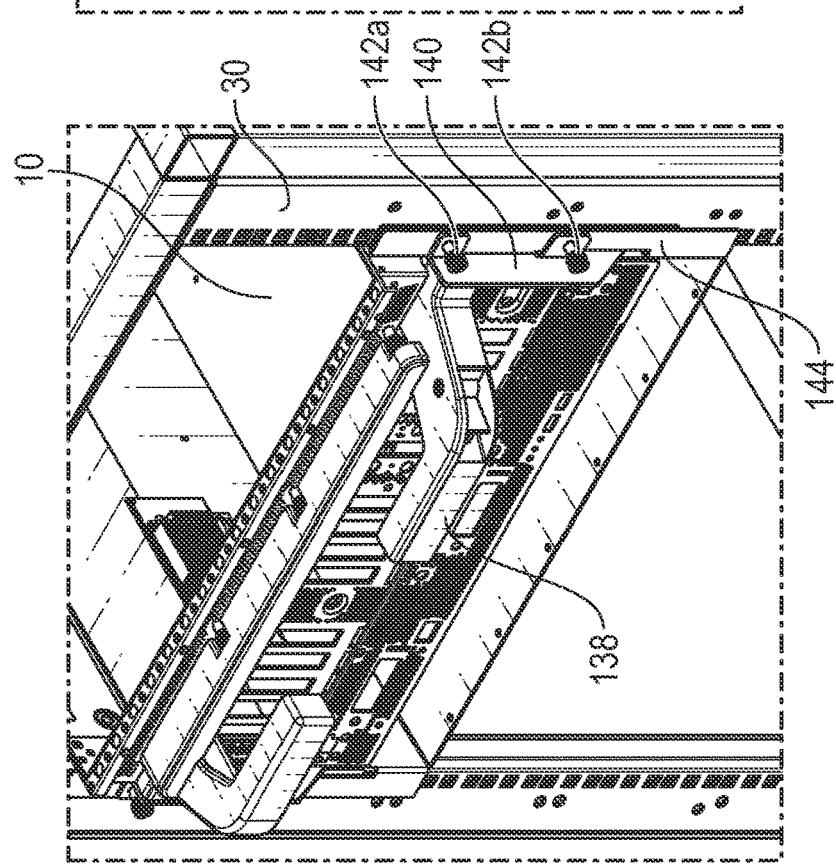
FIG. 10A is an upper left front isometric view of aspects of an embodiment of a system for blind mate hydraulic connections in a first state.
Figure 10C:
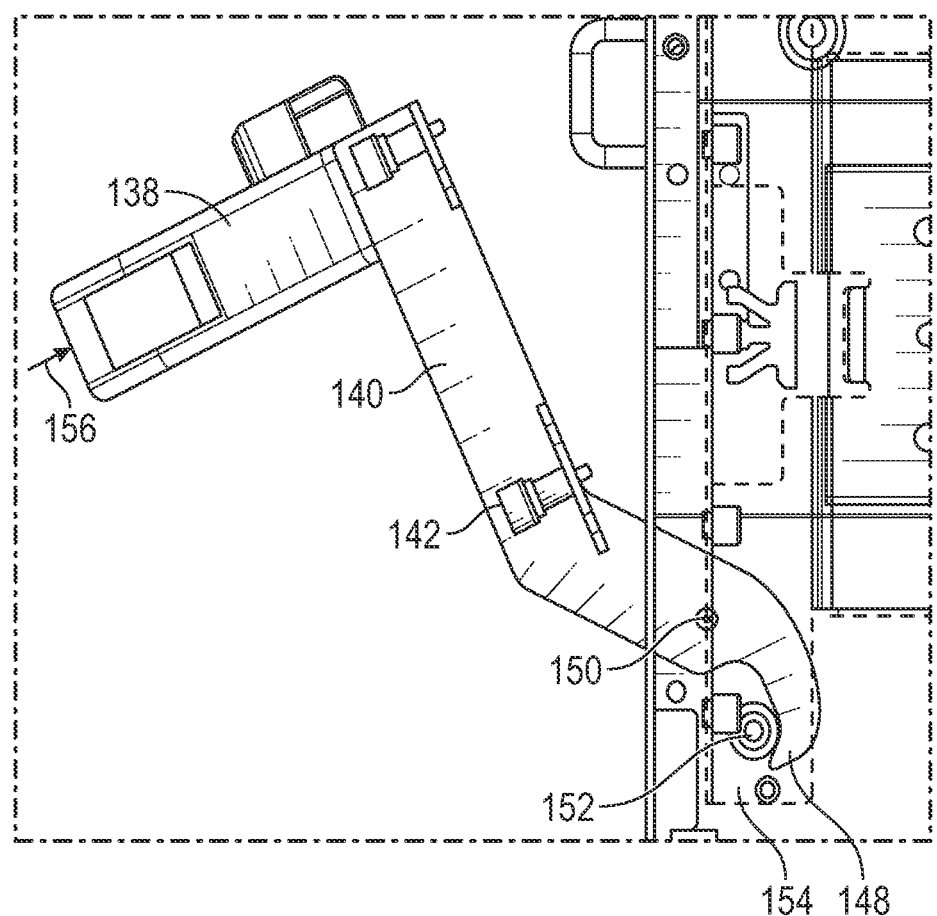
FIG. 10C is a is a right cross-sectional view of aspects of the embodiment of FIG. 10A in a third state.

FIG. 10A is an upper right front isometric view of aspects of embodiments of systems 100, 200 for blind mate hydraulic connections in a first, connected state (corresponding to FIG. 9A and FIG. 9B). In FIG. 10A, device 10 is fully inserted into rack 30, as indicated by a handle 138 being closed against device 10. As shown in FIG. 10A-FIG. 10C, handle 138 includes an arm 140 that rotates about a pivot (150, FIG. 10C) on device 30 and includes a cam hook 148. As handle 138 is moved 156 toward device 10 (i.e., moved from the position shown in FIG. 10C to that of FIG. 10A), cam hook 148 engages a post (152, FIG. 10C) protruding inwardly from rack flange 154 and draws device 10 into rack 30. To prevent handle 138 from opening accidentally, arm 140 may be secured by thumbscrews 142 to threaded holes 146 in a flange 144 of device 10. FIG. 10B illustrates device 10 with handle 138 in the fully open position and device 10 ready to be slid further into rack 30. FIG. 10C illustrates device 10 slid into rack 30 and handle 138 closed until cam hook 148 engages rack post 152. From the position of FIG. 10C, completely closing handle 138 causes device flanges 144 to be brought against rack 30, and bores 132 to receive nozzles 126.

In an embodiment, cam handle 138 assists the user in overcoming the force required to mate bores 132 and nozzles 126, which, for two such connections, may total 500 N or 112 lbf.

Figure 11:
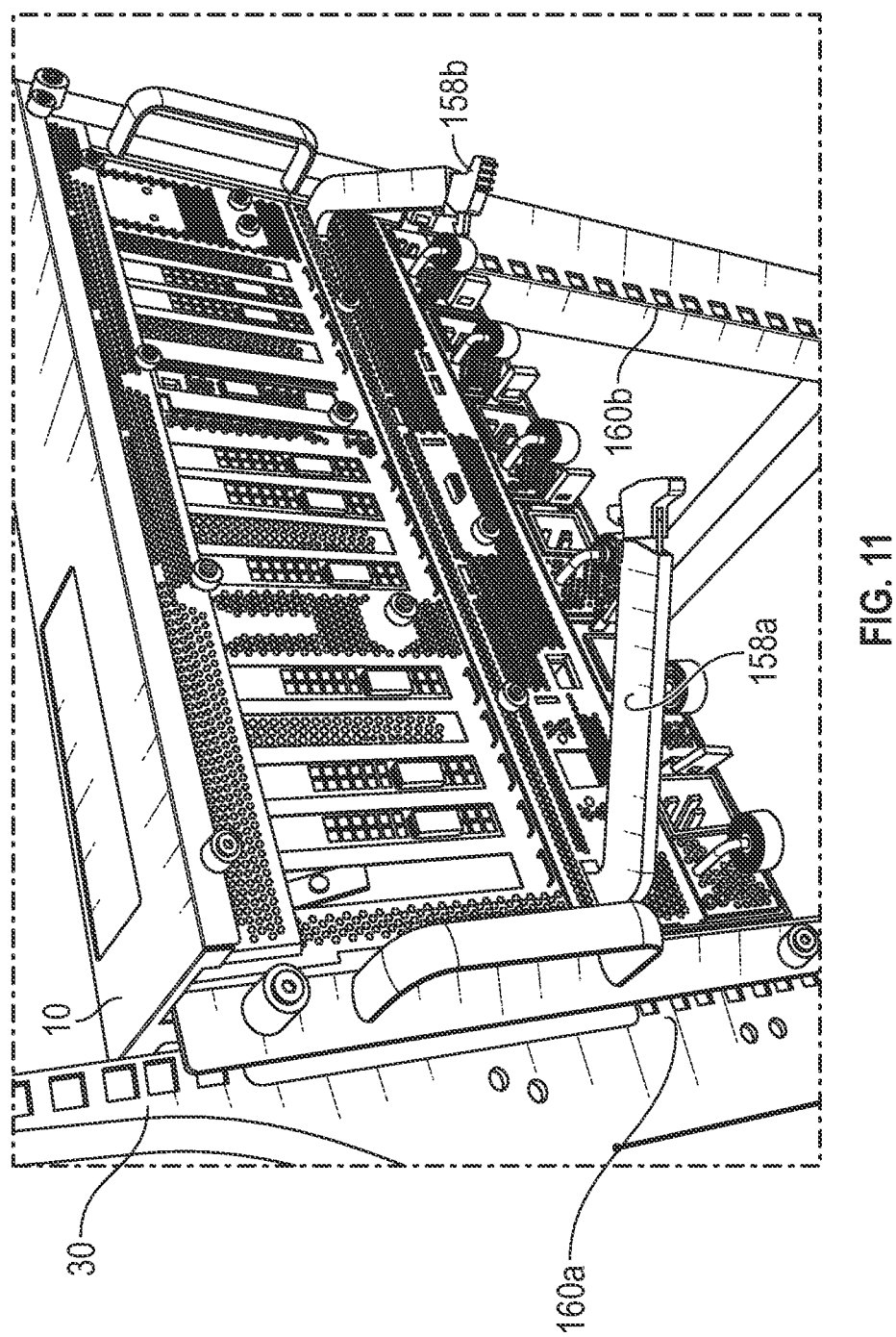
FIG. 11 is an upper left front isometric view of aspects of an embodiment of a system for blind mate hydraulic connections in a first state.

FIG. 11 is an upper left front isometric view of aspects of embodiments of systems 100, 200 for blind mate hydraulic connections in a disconnected state. In FIG. 11, cam handles 158*a*, 158*b* are oriented horizontally, rather than vertically as shown in FIGS. 10A-FIG. 10C. Cam handles 158*a*, 158*b* have cam hooks (not shown) similar to cam hooks 148 that engage rack edges 160 and draw device 10 into rack 30 when handles 158 are closed, which causes bores 132 to receive nozzles 126 as discussed above.

Figure 12:
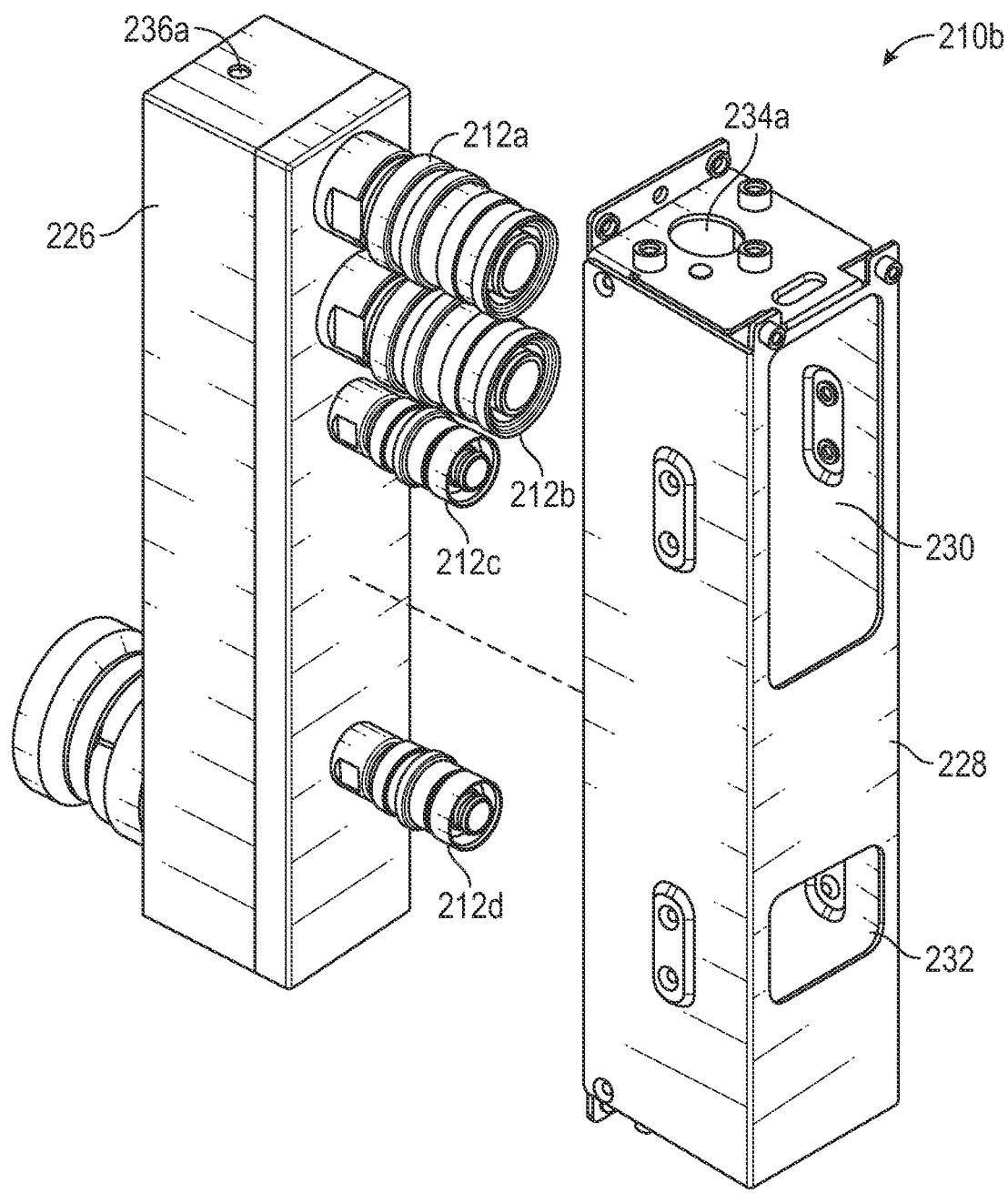
FIG. 12 is an upper left front isometric view of aspects of an embodiment of a system for blind mate hydraulic connections.
Figure 13:
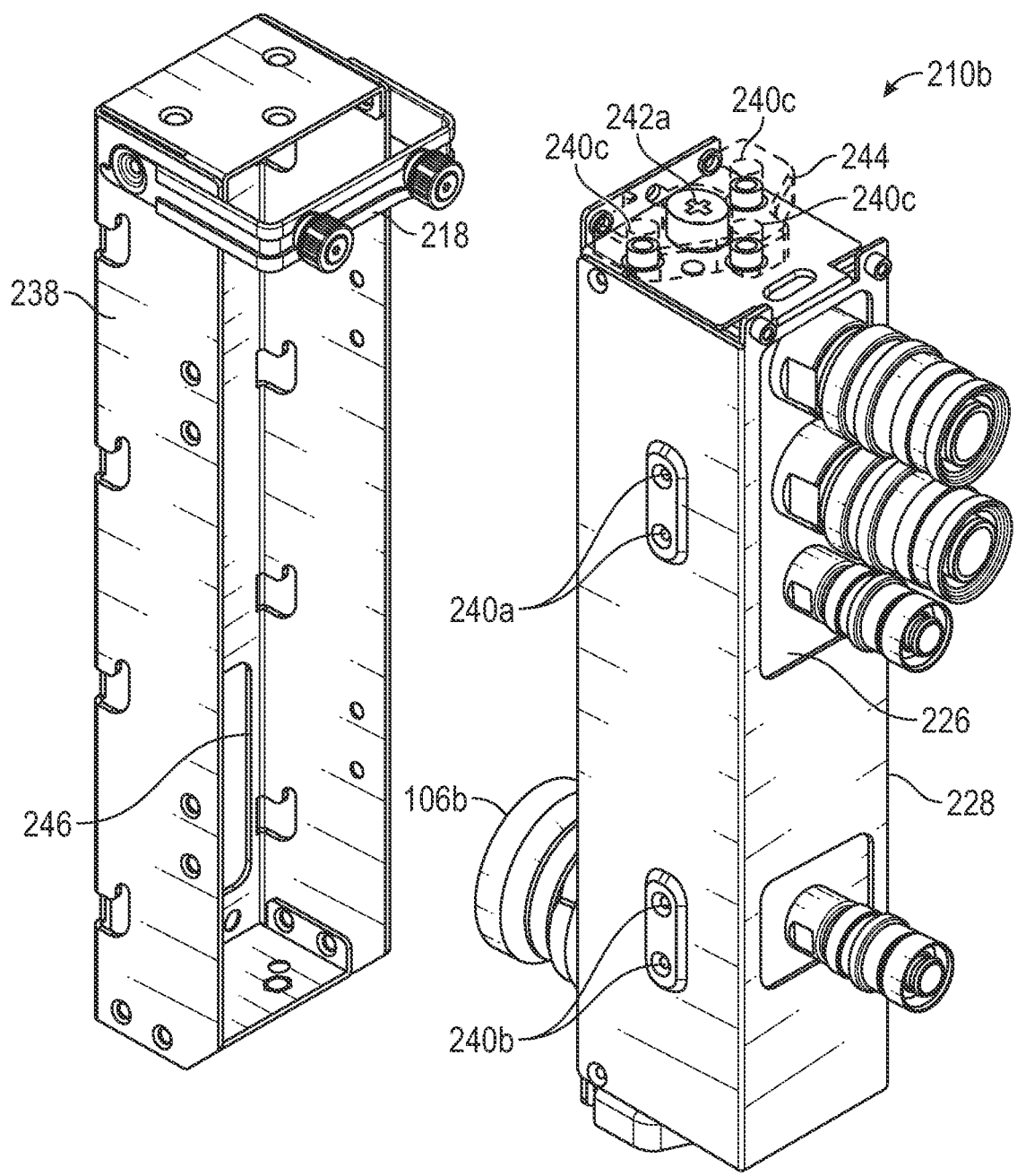
FIG. 13 is an upper left front isometric view of aspects of an embodiment of a system for blind mate hydraulic connections.

FIG. 12 and FIG. 13 illustrate the assembly of manifold 210*b* of FIG. 4 and FIG. 6A. In FIG. 12, manifold 210*b* includes an inner manifold 226 that is received within an inner shell 228. Inner manifold 226 is connected to quick connects 212a . . . 212d and includes a threaded hole 236a. Inner shell 228 includes a slot 234a, and windows 230, 232, which receive quick connects 212a . . . 212d. When inner manifold 226 is received within shell 228, slot 234a aligns with threaded hole 236a. Inner manifold 226 also includes a second threaded hole 236b at the base, which is obscured. Similarly, inner shell 228 includes a second slot 234b at its base, which is also obscured.

In FIG. 13, manifold 210b is shown to include an outer shell 238, which include a window 246. A post 242a is shown threaded into hole 236a through slot 234a and protected by a cover 244 (shown transparent) provided with holes 240c. When the combination of inner manifold 226 and inner shell 228 are received within outer shell 238, quick connect 106b passes through window 246. Outer shell 238 may then be secured to inner shell 228 using fasteners into threaded holes 240a . . . 240c to attain the configuration shown in FIG. 6A-FIG. 9B.

As shown in FIG. 13, post 242a may move forward or backward slightly within slot 234a, but, in this embodiment, is prevented from moving side to side by the edges of the slot. Post 242a may rotate about the z-axis. Similarly, post 242b is permitted the same movement by slot 234b. Thus, inner manifold 226 may tilt forward or rearward, and may rotate about the z-axis, to permit quick connect 106b to align with rack connector 108.

FIG. 12 and FIG. 13 were directed to the assembly of manifolds 210a and 210b. The assembly of manifolds 110a and 110b is similar, except for modifications to the various windows to account for the different type of connection to cold plates 115, i.e., manifold line connector 112 instead of manifold quick connects 212.

Figure 14:
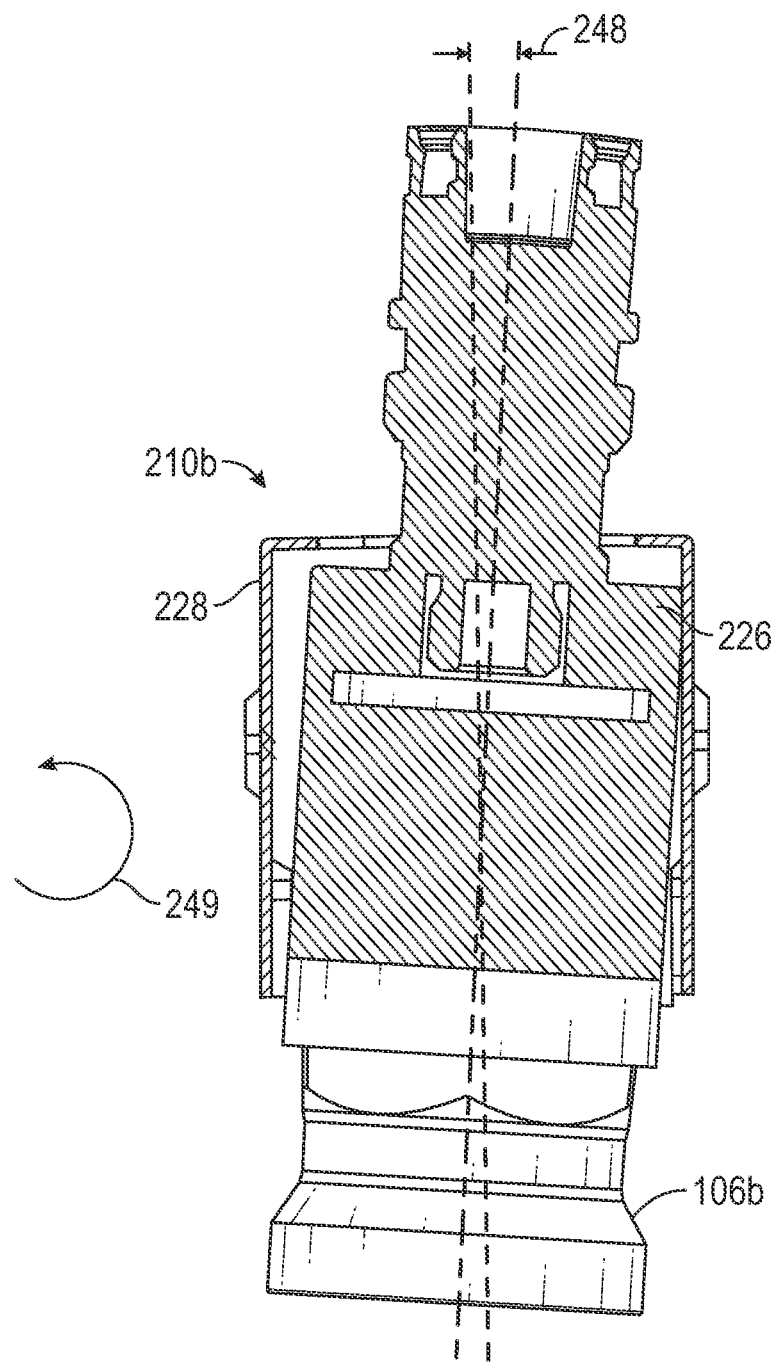
FIG. 14 is a top cross-sectional view of aspects of an embodiment of a system for blind mate hydraulic connections.
Figure 15:
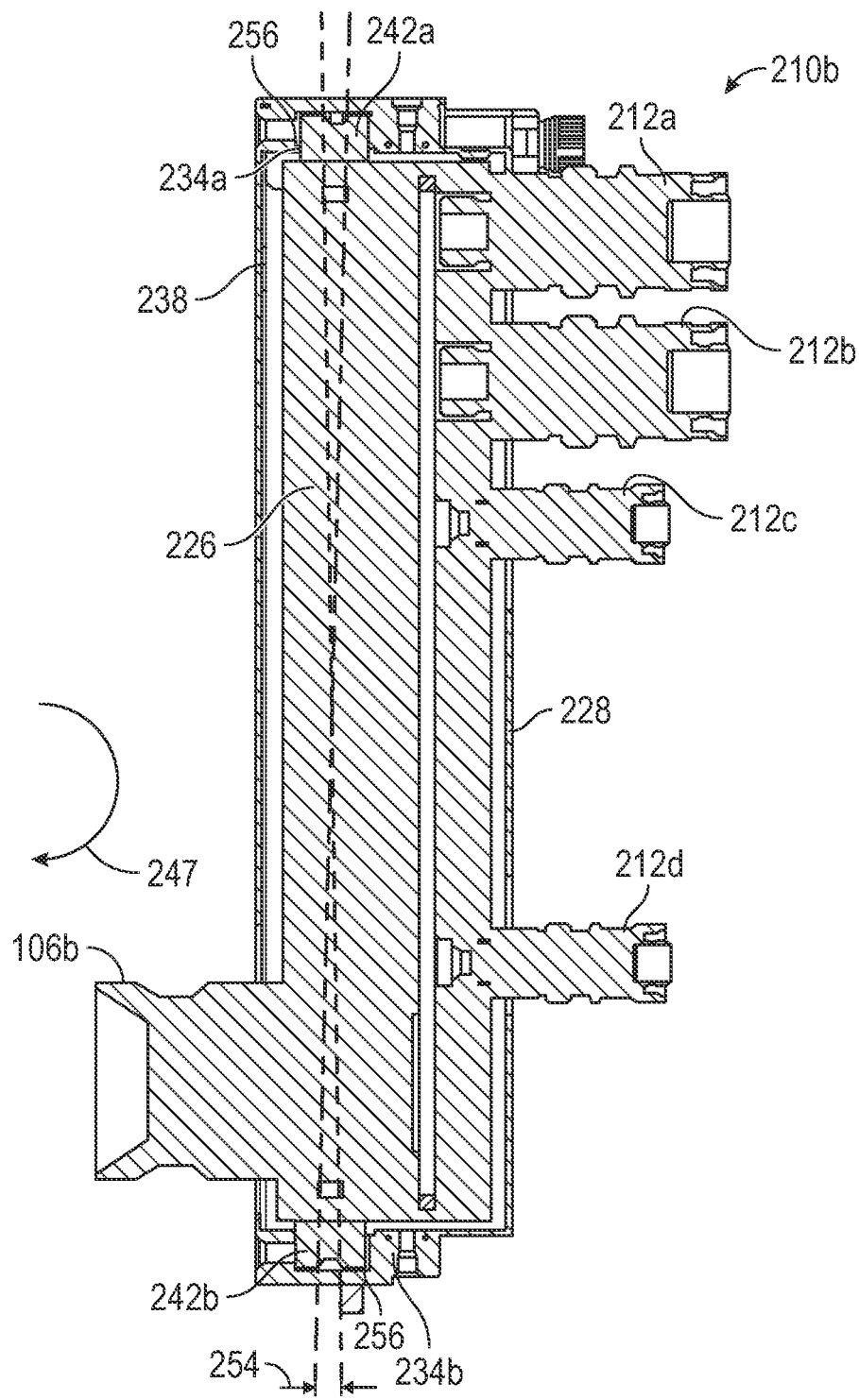
FIG. 15 is a left cross-sectional view 3 of aspects of an embodiment of a system for blind mate hydraulic connections.

FIG. 14 and FIG. 15 are cross-sectional views of aspects of an embodiment of a system for blind mate hydraulic connections. FIG. 14 is a top view that illustrates the ability of inner manifold 226 to rotate 249. This rotation is facilitated by the rotation of posts 242a, 242b within slots 234a, 234b. As a result, inner manifold rotates with respect to inner shell 228 an angular distance 248, which is determined by the travel allowed before inner manifold 226 abuts inner shell 228. In an embodiment, the rotation may be from 2 to 5 degrees clockwise and counter-clockwise.

Similarly, FIG. 15 is a left view that illustrates the ability of inner manifold 226 to tilt 247. This tilt 247 is facilitated by the travel of posts 242a, 242b within slots 234a, 234b. As a result, inner manifold tilts with respect to inner shell 228 an angular distance that is also determined by the travel 247 allowed before inner manifold 226 abuts inner shell 228. In an embodiment, the tilt 247 may be from 1 to 2 degrees forward and backward.

Figure 16:
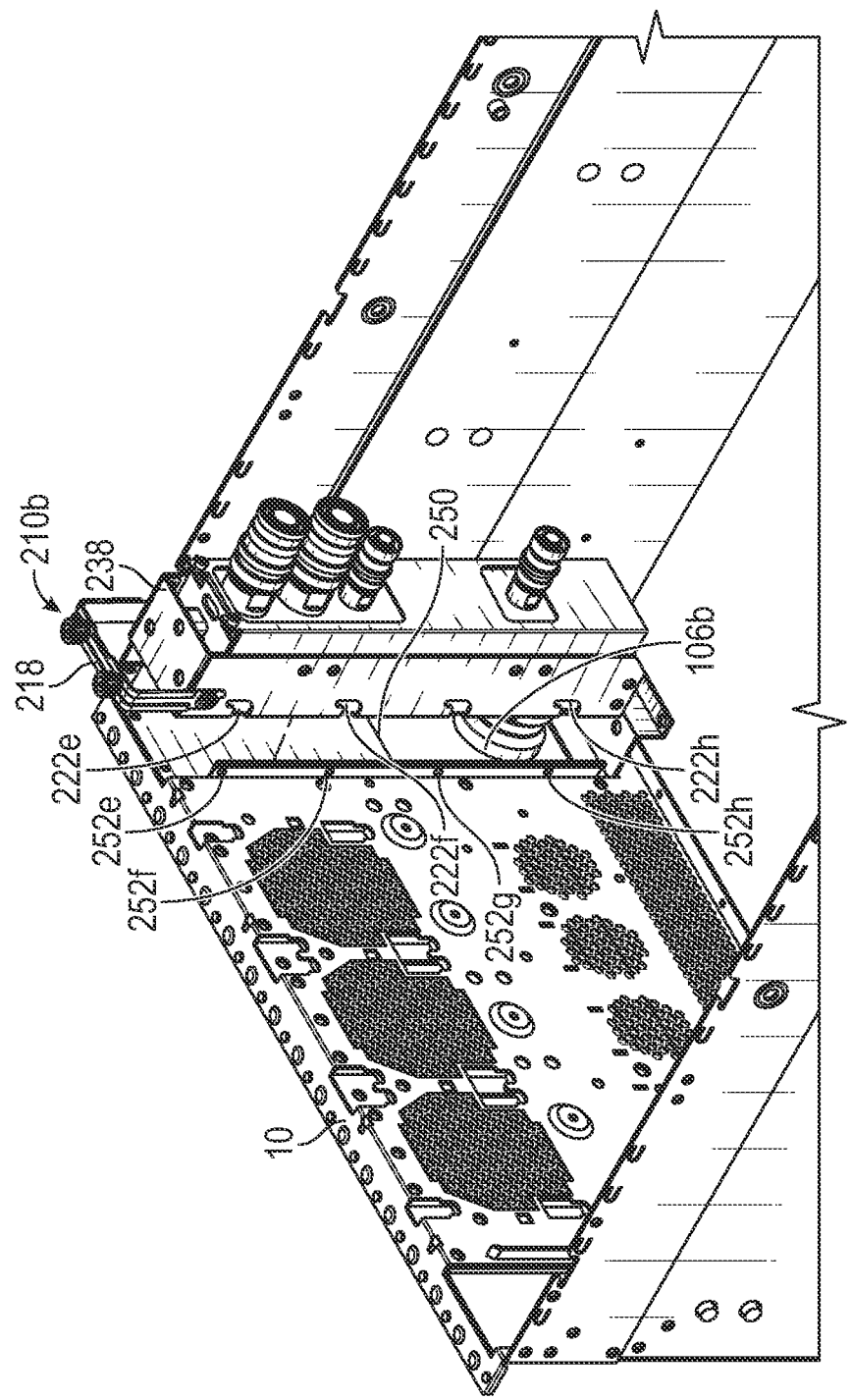
FIG. 16 is an upper left front isometric view of aspects of an embodiment of a system for blind mate hydraulic connections.
Figure 17:
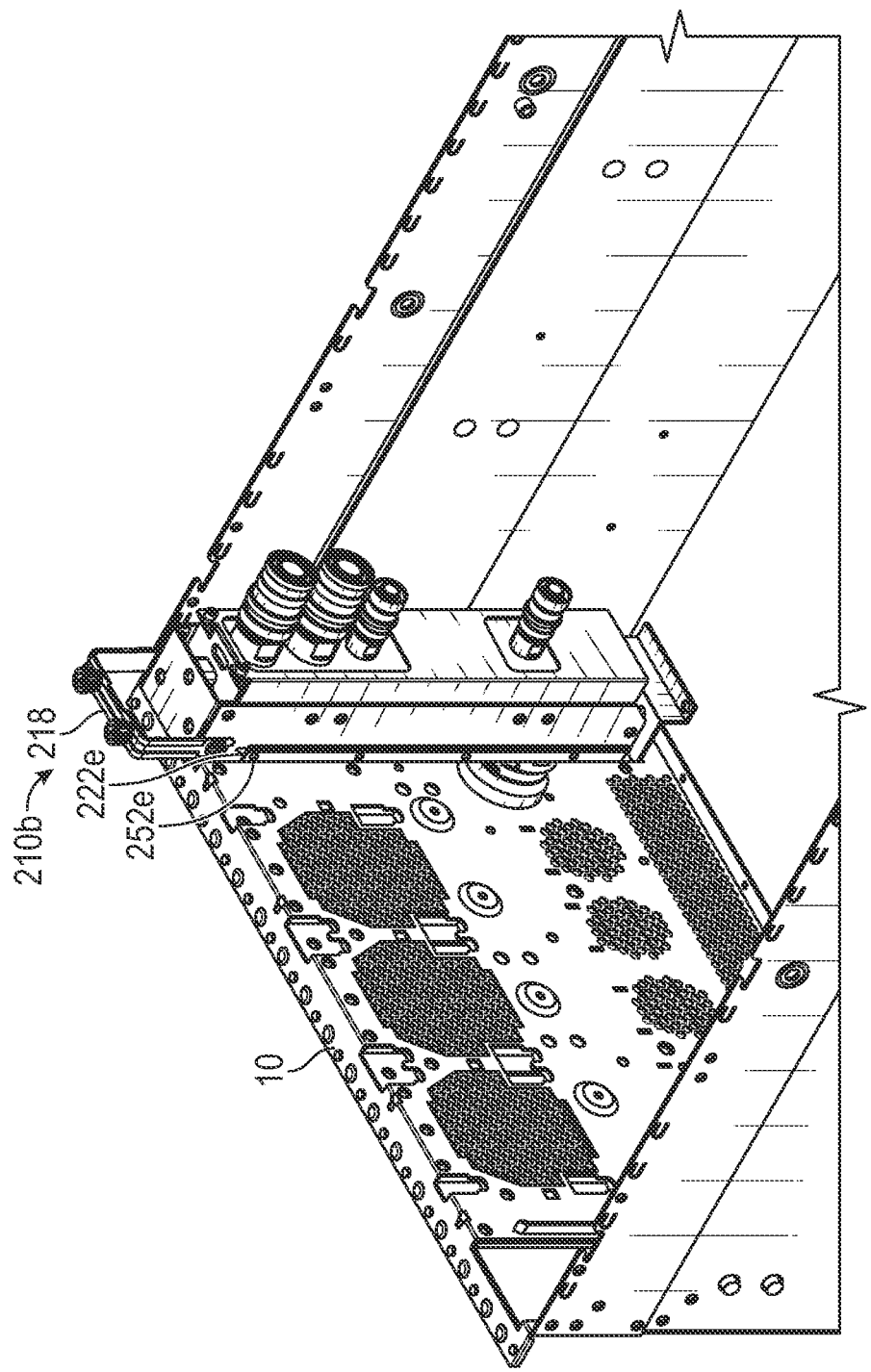
FIG. 17 is an upper left front isometric view of aspects of an embodiment of a system for blind mate hydraulic connections.

FIG. 16 and FIG. 17 are upper left front isometric views of aspects of installing an embodiment of a system for blind mate hydraulic connections. In FIG. 16, manifold 210b is positioned for installation with quick connect 106b just within a window 250 in chassis 10. Chassis 10 further includes posts 252e . . . 252h which are obscured by a chassis flange and protrude from the obscured side of the flange. Manifold mounting slots 222e . . . 222h are configured to receive posts 252e . . . 252h.

In FIG. 17, manifold 210b has been moved into mounting position. Quick connect 106b has passed through window 250 and posts 252e . . . 252h have been received by slots 222c . . . 222h. The raised position of bracket lever 218 indicates that manifold 210b has not yet been fixed in place. Also, an upper region of slot 222e is visible above post 252e, indicating that post 252e has not traveled the entire vertical distance within slot 222c. From the position shown in FIG. 17, rotating bracket lever 218 downward causes it to engage striker 120 and push manifold 210b downward, as shown in FIG. 6A.

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising:
    a first manifold including a first hydraulic fitting configured to connect to a first hydraulic system and a second hydraulic fitting configured to connect to a second hydraulic system;
    a first shell including a first window, the first manifold received within the first shell with the first hydraulic fitting passing through the first window; and
    a second shell including a second window, the first shell received within the second shell with the second hydraulic fitting passing through the second window, wherein:
    a clearance between the first manifold and the first shell allows the first manifold to rotate within the first shell defining a first rotation with respect to a first axis and a second rotation with respect to a second axis, the second axis perpendicular to the first axis, the first rotation and the second rotation allowing the second hydraulic fitting to align to a third hydraulic fitting associated with the second hydraulic system.

2. The apparatus of claim 1, further comprising:
    a first post and a first slot, the first post provided on one of the first manifold or the first shell and the first slot provided in another one of the first manifold or the first shell, the first post translating or rotating within the first slot in response to the first rotation or the second rotation.

3. The apparatus of claim 2, wherein:
the second hydraulic fitting includes a chamfer and a bore; and
the third hydraulic fitting includes a nozzle configured to be received within the bore, wherein, when the nozzle is moved toward the bore, and when the nozzle and the bore are misaligned, the nozzle encounters the chamfer and, with further movement toward the bore, the nozzle travels along the chamfer into the bore and, as the nozzle travels along the chamfer, the first manifold undergoes one or both of all or part of the first rotation or all or part of the second rotation.

4. The apparatus of claim 3, the second shell including a plurality of second slots configured to receive a plurality of second posts associated with a device, wherein the plurality of second slots and the plurality of second posts cooperate to assist in retaining the second shell in a first position with respect to a face of the device.

5. The apparatus of claim 4, further including a lever pivotable between a first position and a second position with respect to the second shell and including a tooth, wherein:
when the lever is in the first position and the plurality of second slots have received the plurality of second posts, the tooth engages the device and hinders the disengagement of the plurality of second slots from the plurality of second posts; and
when the lever is in the second position and the plurality of second slots have received the plurality of second posts, the tooth does not engage the device and hinder the disengagement of the plurality of second slots from the plurality of second posts.

6. The apparatus of claim 1, the first hydraulic fitting including a second manifold having a plurality of fourth hydraulic fittings configured to connect to the first hydraulic system.

7. A system comprising:
a device;
a manifold including a first hydraulic fitting connected to a first hydraulic system within the device and a second hydraulic fitting configured to connect to a third hydraulic fitting associated with a second hydraulic system;
a first shell including a first window, the manifold received within the first shell with the first hydraulic fitting passing through the first window;
a second shell including a second window, the first shell received within the second shell with the second hydraulic fitting passing through the second window; and
a arm including a hook pivotally connected to the device, wherein, when:
the device is placed into a rack, and
the hook engages the rack;
pivoting the arm with respect to the device causes the hook to draw the device into the rack and the second hydraulic fitting to connect to the third hydraulic fitting completing a hydraulic connection between first hydraulic system and the second hydraulic system.

8. The system of claim 7, wherein a clearance between the manifold and the first shell allows the manifold to rotate within the first shell defining a first rotation with respect to a first axis and a second rotation with respect to a second axis, the second axis perpendicular to the first axis; and, when the hook draws the device into the rack, the first rotation and the second rotation allow the second hydraulic fitting to align to the third hydraulic fitting to complete the hydraulic connection.

9. The system of claim 8, further comprising:
a first post and a first slot, the first post provided on one of the manifold or the first shell and the first slot provided in another one of the manifold or the first shell, the first post translating or rotating within the first slot in response to the first rotation or the second rotation.

10. The system of claim 9, wherein:
the second hydraulic fitting includes a chamfer and a bore; and
the third hydraulic fitting includes a nozzle configured to be received within the bore, wherein, when the nozzle is moved toward the bore, and when the nozzle and the bore are misaligned, the nozzle encounters the chamfer and, with further movement toward the bore, the nozzle travels along the chamfer into the bore and, as the nozzle travels along the chamfer, the manifold undergoes one or both of a part of the first rotation or a part of the second rotation.

11. The system of claim 9, the second shell including a plurality of second slots configured to receive a plurality of second posts associated with the device, wherein the plurality of second slots and the plurality of second posts cooperate to assist in retaining the second shell in a first position with respect to a face of the device.

12. The system of claim 11, further including a lever pivotable between a first position and a second position with respect to the second shell and including a tooth, wherein:
when the lever is in the first position and the plurality of second slots have received the plurality of second posts, the tooth hinders the disengagement of the plurality of second slots from the plurality of second posts; and
when the lever is in the second position and the plurality of second slots have received the plurality of second posts, the tooth does not hinder the disengagement of the plurality of second slots from the plurality of second posts.

13. A method for connecting a first hydraulic system to a second hydraulic system, the method comprising:
providing a device with:
a manifold including a first hydraulic fitting connected to the first hydraulic system within the device and a second hydraulic fitting configured to connect to a third hydraulic fitting associated with the second hydraulic system;
a first shell including a first window, the manifold received within the first shell with the first hydraulic fitting passing through the first window;
a second shell including a second window, the first shell received within the second shell with the second hydraulic fitting passing through the second window; and
a arm including a hook pivotally connected to the device; placing the device into a rack;
pivoting the arm such that the hook engages the rack; further pivoting the arm causing the hook to draw the device into the rack and the second hydraulic fitting to connect to the third hydraulic fitting thereby completing a hydraulic connection between the first hydraulic system and the second hydraulic system.

14. The method of claim 13, wherein a clearance between the manifold and the first shell allows the manifold to rotate within the first shell defining a first rotation with respect to a first axis and a second rotation with respect to a second axis, the second axis perpendicular to the first axis; and, when the hook draws the device into the rack, the first rotation and the second rotation allow the second hydraulic fitting to align with the third hydraulic fitting associated to complete the hydraulic connection.

15. The method of claim 14, further providing the device with:
- a post and a slot, the post provided on one of the manifold or the first shell and the slot provided in another one of the manifold or the first shell, the post translating or rotating within the slot in response to the first rotation or the second rotation.

16. The method of claim 15, wherein:
the second hydraulic fitting includes a chamfer and a bore; and
the third hydraulic fitting includes a nozzle configured to be received within the bore, wherein, when the nozzle is drawn toward the bore, and when the nozzle and the bore are misaligned, the nozzle encounters the chamfer and, with further movement toward the bore, the nozzle travels along the chamfer into the bore and, as the nozzle travels along the chamfer, the manifold undergoes one or both of a part of the first rotation or a part of the second rotation.

\* \* \* \* \*